(12) United States Patent
Lu (10) Patent No.: US 12,089,401 B2
(45) Date of Patent: Sep. 10, 2024

(54) SEMICONDUCTOR STRUCTURE AND PREPARATION METHOD THEREOF

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 349 days.

(21) Appl. No.: 17/575,876

(22) Filed: Jan. 14, 2022

(65) Prior Publication Data

US 2022/0320108 A1 Oct. 6, 2022

Related U.S. Application Data

(63) Continuation of application No. PCT/CN2021/106682, filed on Jul. 16, 2021.

(30) Foreign Application Priority Data

Mar. 30, 2021 (CN) .......................... 202110342460.2

(51) Int. Cl.
  *H10B 12/00* (2023.01)
  *H01L 21/768* (2006.01)

(52) U.S. Cl.
  CPC ...... *H10B 12/482* (2023.02); *H01L 21/76811* (2013.01); *H10B 12/03* (2023.02); *H10B 12/30* (2023.02)

(58) Field of Classification Search
  CPC ...... H10B 12/482; H10B 12/03; H10B 12/30; H10B 12/0335; H01L 21/76811; H01L 21/76816; H01L 21/76885; H01L 21/76897
  See application file for complete search history.

(56) References Cited

U.S. PATENT DOCUMENTS

| 6,461,911 B2 | 10/2002 | Ahn |
| 7,384,841 B2 | 6/2008 | Yoon |
| 2001/0046737 A1 | 11/2001 | Ahn |
| 2002/0154556 A1* | 10/2002 | Endoh ................ H01L 29/7883 257/E27.103 |

(Continued)

FOREIGN PATENT DOCUMENTS

| CN | 110970351 A | 4/2020 |
| CN | 113097144 A | 7/2021 |

*Primary Examiner* — Yasser A Abdelaziz
(74) *Attorney, Agent, or Firm* — Syncoda LLC; Feng Ma (57) ABSTRACT

A preparation method of a semiconductor structure includes: providing a base; forming several bit lines arranged in parallel and at intervals on the base, which extend in a first direction; forming capacitor contact material layers between adjacent bit lines, upper surfaces of which are lower than upper surfaces of the bit lines; forming filling medium layers on the capacitor contact material layers; forming several first mask patterns arranged in parallel and at intervals on the filling medium layers and the bit lines, which extend in a second direction that intersects with the first direction; patterning the filling medium layers based on the first mask patterns to form several grooves in the filling medium layers; forming second mask patterns in the grooves; and patterning the capacitor contact material layers based on the second mask patterns to form several cylindrical capacitor contact structures arranged in parallel and at intervals.

9 Claims, 9 Drawing Sheets

(56) References Cited

U.S. PATENT DOCUMENTS

2006/0197131 A1    9/2006  Yoon
2010/0327407 A1*  12/2010  Kang .................. H10B 12/482
                                                              257/532
2021/0104529 A1*  4/2021  Choi ................... H10B 12/488

* cited by examiner

SEMICONDUCTOR STRUCTURE AND PREPARATION METHOD THEREOF

CROSS-REFERENCE TO RELATED APPLICATIONS

The present application is a continuation application of International Application No. PCT/CN2021/106682, filed on Jul. 16, 2021, which claims priority to China Patent Application No. 202110342460.2, filed on Mar. 30, 2021. The disclosures of International Application No. PCT/CN2021/106682 and China Patent Application No. 202110342460.2 are hereby incorporated by reference in their entireties.

BACKGROUND

A dynamic random access memory (DRAM) is a semiconductor storage device commonly used in computers. With the continuous development of microelectronics technology, the volume of the DRAM is getting smaller and smaller, and the leakage phenomenon between a node contact (NC) and a bit line (BL) is getting more and more serious.

SUMMARY

The present disclosure relates to the technical field of manufacturing of integrated circuits, and in particular to a semiconductor structure and a preparation method thereof.

According to some embodiments of the present disclosure, a semiconductor structure and a preparation method thereof are provided.

A preparation method of a semiconductor structure includes operations as follow. A base is provided. Several bit lines arranged in parallel and at intervals are formed and the bit lines extend in a first direction. Capacitor contact material layers between adjacent bit lines are formed, in which upper surfaces of the capacitor contact material layers are lower than upper surfaces of the bit lines. Filling medium layers are formed on the capacitor contact material layers. Several first mask patterns arranged in parallel and at intervals are formed on the filling medium layers and the bit lines, in which the first mask patterns extend in a second direction, and the second direction intersects with the first direction. The filling medium layers are patterned based on the first mask patterns to form several grooves therein. Second mask patterns are formed in the grooves. The capacitor contact material layers are patterned based on the second mask patterns to form several cylindrical capacitor contact structures arranged in parallel and at intervals.

A semiconductor structure includes a base, several bit lines are arranged on the base in parallel at intervals and extend in a first direction; and cylindrical capacitor contact structures are located between adjacent bit lines on the base.

BRIEF DESCRIPTION OF THE DRAWINGS

In order to describe technical solutions in the embodiments of the present disclosure or in the traditional art more clearly, drawings required to be used in the embodiments or the illustration of the traditional technology are briefly introduced below. Apparently, the drawings in the illustration below are only some embodiments of the present disclosure. Those ordinarily skilled in the art also can acquire other drawings according to the provided drawings without doing creative work.

FIG. 2b is a top view of a first mask layer formed on the base shown in FIG. 2a.

FIG. 2c is a three-dimensional schematic structural diagram of a bit line contact structure formed on the base shown in FIG. 2a.

Reference signs in the drawings: 101 first material layer; 102 shallow trench isolation structure; 103 active region; 104 buried gate word line; 105 first mask layer; 106 bit line contact structure; 201 second mask layer; 202 coverage medium layer; 203 second conductive material layer; 204 first conductive material layer; 205 third mask pattern; 206 bit line side wall; 207 coverage medium layer; 208 second conductive layer; 209 first conductive layer; 301 capacitor contact material layer; 302 filling medium layer; 303 first mask pattern; 304a first initial groove; 304b second initial groove; 305 groove; 306 second mask pattern; 307 isolation medium layer; 308 capacitor contact structure.

DETAILED DESCRIPTION

For convenience of an understanding of the present disclosure, the present disclosure will be described more fully below with reference to the related drawings. Preferred embodiments of the present disclosure are shown in the accompanying diagrams. The present disclosure may, however, be embodied in many different forms which are not limited to the embodiments described herein. Rather, the purpose of providing these embodiments is to provide a more complete understanding of the content of the disclosure.

Unless defined otherwise, all technical and scientific terms used in the present disclosure have the same meaning as commonly understood by those skilled in the art. The terms used in the specification of the present disclosure are for the purpose of describing specific embodiments only and are not intended to be limiting of the present disclosure. The term "and/or" used herein includes any and all combinations of one or more related listed items.

During description of positional relationships, unless otherwise specified, when an element such as a layer, film or base plate is referred to as being "on" another film layer, it can be directly on the other film layer or an intermediate film layer may also be present. Furthermore, when a layer is referred to as being "under" another layer, it can be directly below, or there may be one or more intermediate layers. It can be also understood that when a layer is referred to as being "between" two layers, it can be the only layer between the two layers, or one or more intermediate layers may also be present.

In the case of using the "including", "having", and "comprising" described herein, unless a clear qualified term is used, such as "only", "consisting of", and the like, another component may be added. Unless mentioned to the contrary, terms in the singular form may include the plural form, and it cannot be understood that the number is one.

Figure 1:
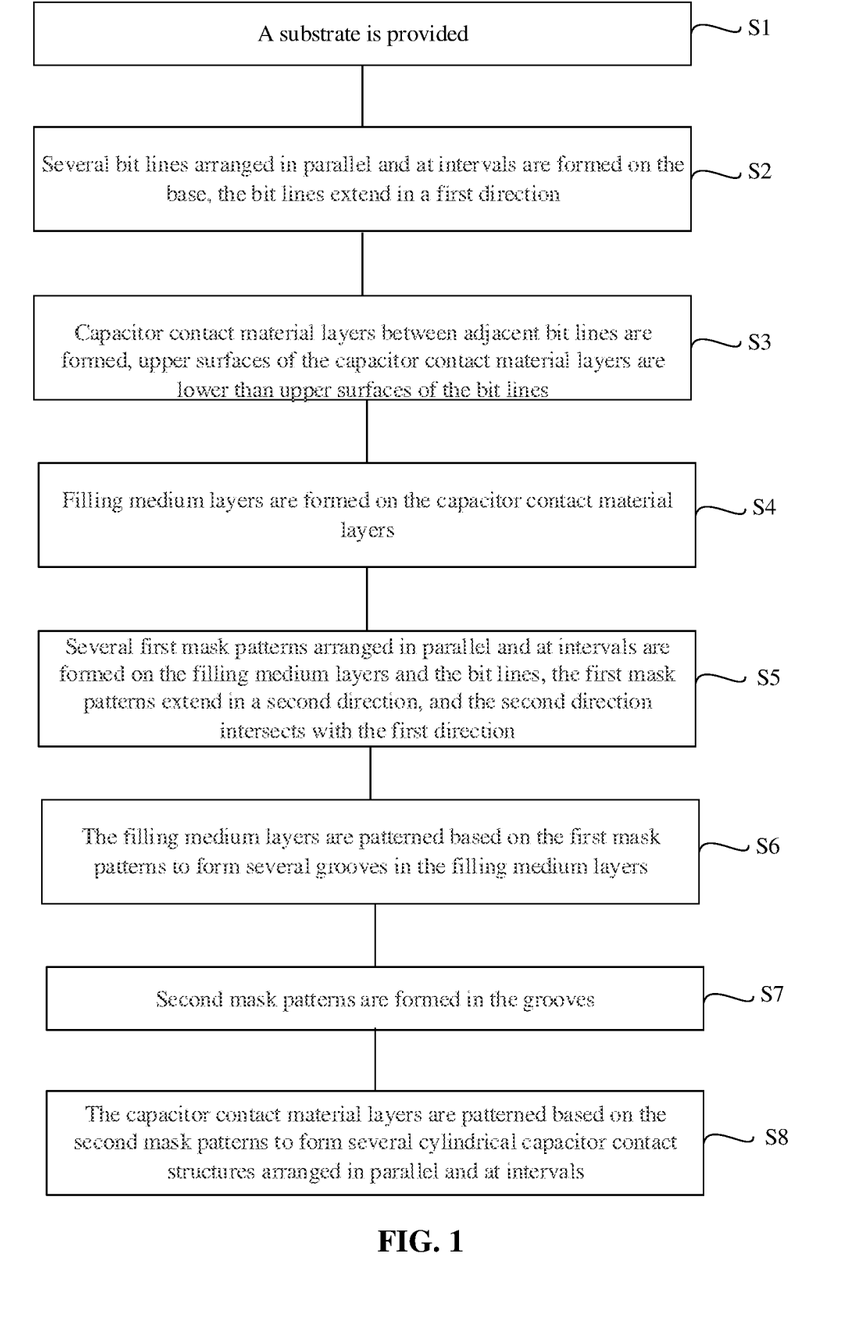
FIG. 1 is a flowchart of a preparation method of a semiconductor structure in one embodiment.

One embodiment of the present disclosure provides a preparation method of a semiconductor structure, as shown in FIG. 1, including the following operations.

At S1, a base is provided.

At S2, several bit lines arranged in parallel and at intervals are formed on the base, the bit lines extend in a first direction.

At S3, capacitor contact material layers are formed between adjacent bit lines, upper surfaces of the capacitor contact material layers are lower than upper surfaces of the bit lines.

At S4, filling medium layers are formed on the capacitor contact material layers.

At S5, several first mask patterns arranged in parallel and at intervals are formed on the filling medium layers and the bit lines, the first mask patterns extend in a second direction, and the second direction intersects with the first direction.

At S6, the filling medium layers are patterned based on the first mask patterns to form several grooves in the filling medium layers.

At S7, second mask patterns are formed in the grooves.

At S8, the capacitor contact material layers are patterned based on the second mask patterns to form several cylindrical capacitor contact structures arranged in parallel and at intervals.

Figure 2A:
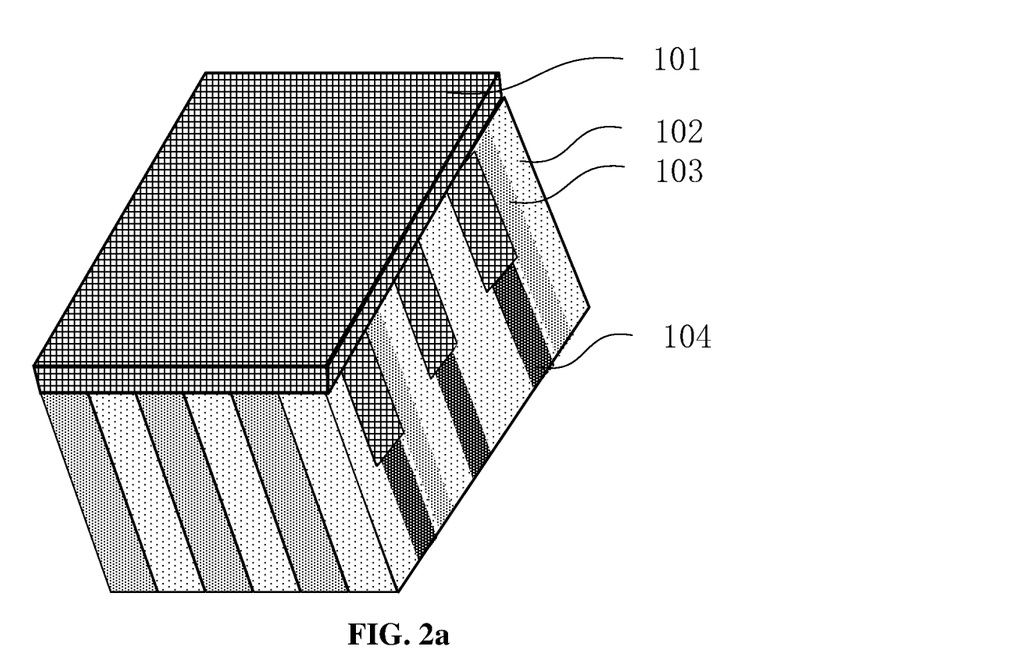
FIG. 2a is a three-dimensional schematic structural diagram of a base in one embodiment.

The base provided in S1 is shown in FIG. 2a. Optionally, the base may include several word lines arranged in parallel and at intervals. The word lines may be buried gate word lines 104 extending in the second direction. The first direction is parallel to a lengthwise direction of the base, and the second direction is parallel to a width direction of the base.

Optionally, shallow trench isolation structures 102 may also be formed in the base to isolate several active regions 103 arranged in parallel and at intervals. As an example, the shallow trench isolation structures 102 are made of silicon dioxide, and the active regions 103 are prepared from a silicon substrate. The active regions 103 extend in a third direction which intersects with both the first direction and the second direction.

Continuing to refer to FIG. 2a, the upper surface of the base is also covered with a first material layer 101 to form a flat base surface. In addition, the first material layer 101 may also be etched to form a specific etched pattern to prepare connection structures between different structural members, such as bit line contact structures which can be used to connect the bit lines to the active regions 103. As an example, the first material layer 101 may be a silicon nitride layer.

At the step S2, several bit lines arranged in parallel and at intervals are formed on the base. The bit lines extend in the first direction. Before the preparation of the bit lines, bit line contact structures needs to be first formed on the base.

The formation of bit line contact structures includes the following operations. A bit line contact hole is formed in the substrate. The bit line contact hole is located between adjacent buried gate word lines 104 across the same active region 103 and is in contact with the active region 103. A bit line contact structure is formed in the bit line contact hole. The bit line contact structure 106 is located between the active region 103 and the bit line, and is in contact with the active region 103 and the bit line.

Figure 2B:
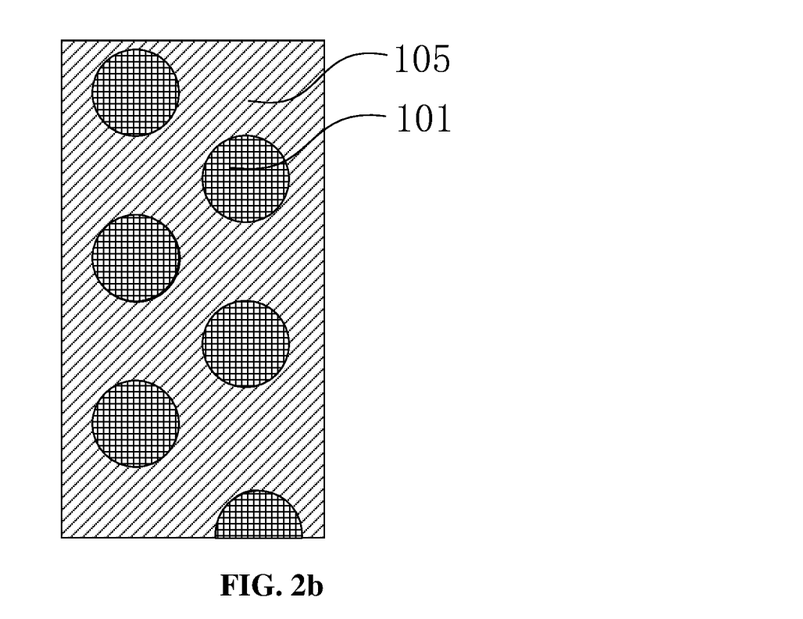

Specifically, as shown in FIG. 2b, in order to form the bit line contact hole, a first mask layer 105 with a round hole may be formed on the first material layer 101 on the upper surface of the base. The round hole in the first mask layer 105 is used to define the position of the bit line contact hole. The first material layer 101 is exposed in the round hole. A center of the round hole and a center line of the bit line are on the same vertical plane. Based on the first mask layer 105, the first material layer 101 is etched, and a round hole is formed in the first material layer 101, thus obtaining the bit line contact hole.

Figure 2C:
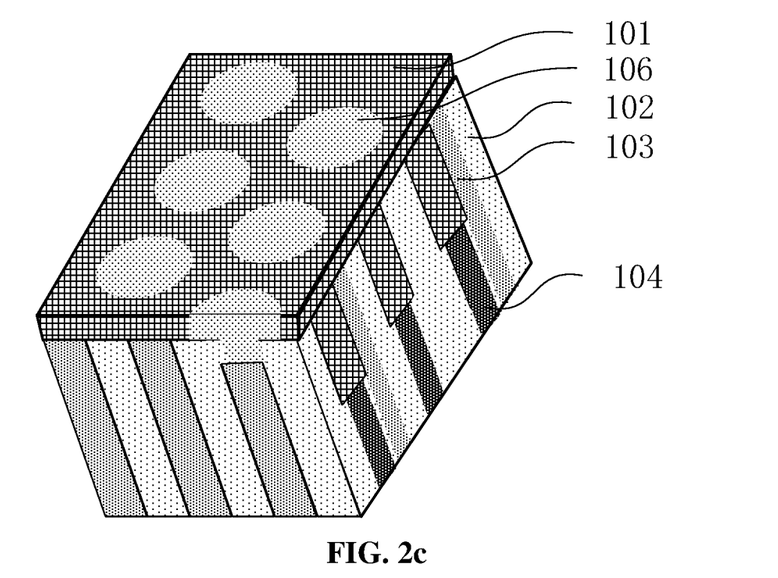

As shown in FIG. 2c, after the bit line contact hole is obtained, the bit line contact hole can be filled with polycrystalline silicon to obtain the cylindrical bit line contact structure 106 made from polycrystalline silicon. Optionally, in a subsequent process, when a bit line is formed above the first material layer 101 and the bit line contact structure 106, a connecting line of center points of the bit line contact structures 106 in the same row coincides the center line of the bit line. Since the bit line contact structure 106 is located between the active region 103 and the bit line, and is in contact with the active region 103 and the bit line, the bit line contact structure 106 may establish an electrical connection relationship between the active region 103 and the bit line.

Figure 3:
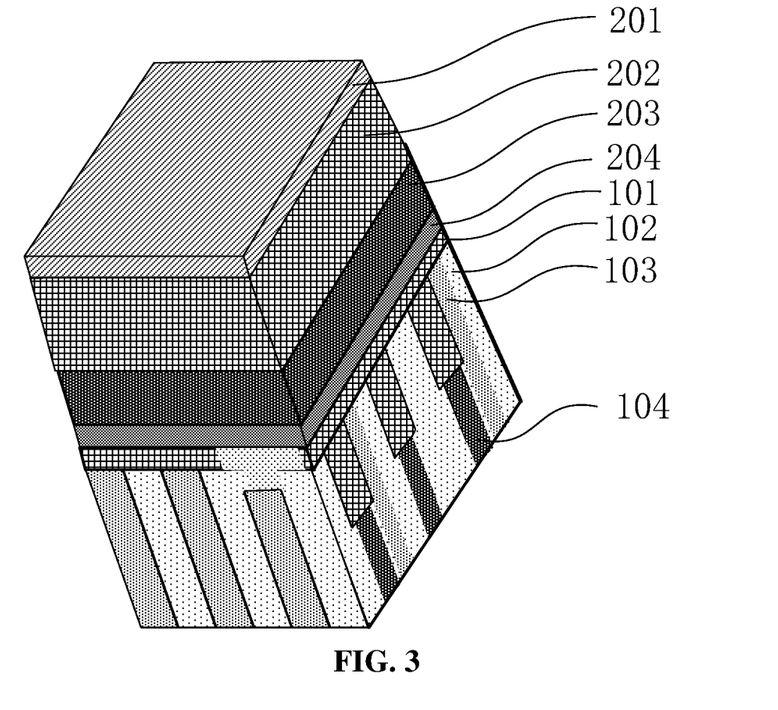
FIG. 3 is a three-dimensional schematic structural diagram of various material layers formed on the base shown in FIG. 2.
Figure 4:
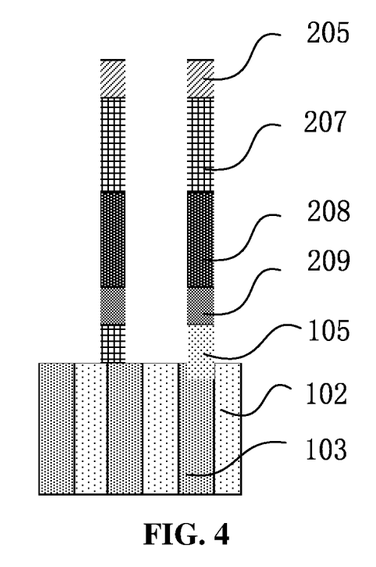
FIG. 4 is a front view of a semiconductor structure obtained after bit lines are formed in one embodiment.

Referring to FIG. 3 and FIG. 4, after forming the bit line contact structures 106, the formation of several bit lines arranged in parallel and at intervals on the base includes the following.

At S21, a first conductive material layer 204, a second conductive material layer 203, and a coverage medium material layer 202 sequentially stack from bottom up on the base, and a third mask patterns 205 are formed on the coverage medium material layer 202.

Specifically, the first conductive material layer 204 may be a titanium nitride layer, and the second conductive material layer may be a metal tungsten layer. In one embodiment, only one conductive material layer may be provided, for example, only a titanium nitride layer, or only a metal tungsten layer is provided. The coverage medium material layer 202 may be a silicon nitride layer.

In order to form the third mask patterns 205, a second mask layer 201 may be first formed on an upper surface of the coverage medium material layer 202. Then, the second mask layer 201 is etched to form the third mask patterns 205. As an example, the third mask patterns 205 may be a rectangle extending in the first direction.

At S22, the coverage medium material layer 202, the second conductive material layer 203, and the first conductive material layer 204 are patterned based on the third mask patterns 205 to obtain a stacked structures including a first conductive layer 209, a second conductive layer 208 and the coverage medium layer 207 which are stacked from bottom up.

As an example, After the coverage medium material layer 202, the second conductive material layer 203, and the first conductive material layer 204 are patterned based on the third mask patterns 205, the front view of the stacked structures obtained is as shown in FIG. 4.

Figure 5:
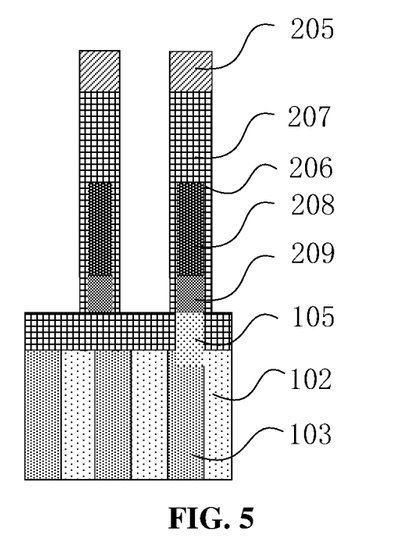
FIG. 5 is a front view of a semiconductor structure obtained after bit line side walls are formed in one embodiment.

At S23, bit line side walls are formed on side walls of the stacked structures.

As shown in FIG. 5, in order to prevent the metal in the conductive material layer from being oxidized in the air, the bit line side walls 206 needs to be prepared on the side walls of the bit lines to wrap the bit lines. As an example, the material of the bit line side walls 206 may be silicon nitride or may be of a side wall structure prepared from a silicon nitride-silicon oxide-silicon nitride structure.

Figure 6:
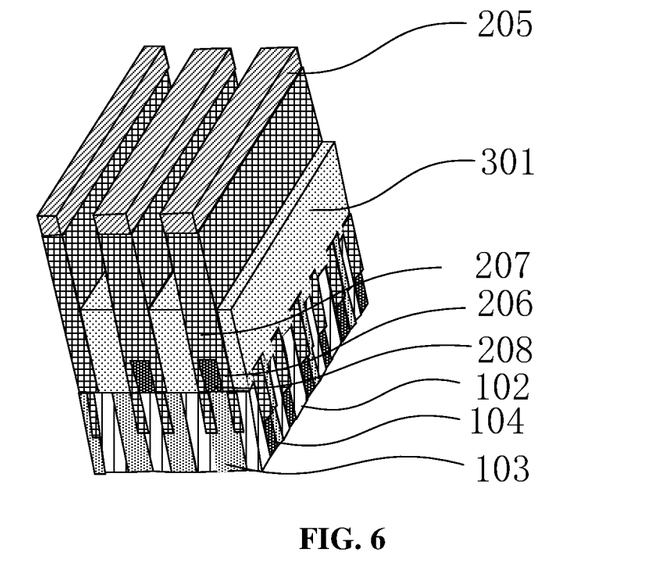
FIG. 6 is a three-dimensional schematic structural diagram of filling of a capacitor contact material layer in one embodiment.

At S3, capacitor contact material layers are formed between adjacent bit lines, and upper surfaces of the capacitor contact material layers are lower than upper surfaces of the bit lines. Before the capacitor contact material is formed between the adjacent bit lines, it is also necessary to remove a side wall preparation material between the adjacent bit lines and on the upper surface of the base. That is because during the preparation of the side wall structures, part of the side wall preparation material will inevitably be deposited on the upper surface of the base to cover capacitor lead contact holes. By means of clearing away the side wall preparation material layer located on the upper surface of the base and between the bit line side walls 206, the capacitor lead contact holes can be exposed, and the capacitor lead contact holes are filled in the capacitor contact material, so that the finally prepared capacitor contact structures 308 establish electrical connection with a capacitor lead. The material of the capacitor contact material layers may be polycrystalline silicon.

The capacitor contact material layers 301 formed between adjacent bit lines are as shown in FIG. 6. The upper surfaces of the capacitor contact material layers 301 are lower than the upper surfaces of the bit lines. Optionally, only one conductive layer may be provided in a bit line. For example, in FIG. 6, the bit line only includes the second conductive layer 208.

Figure 7:
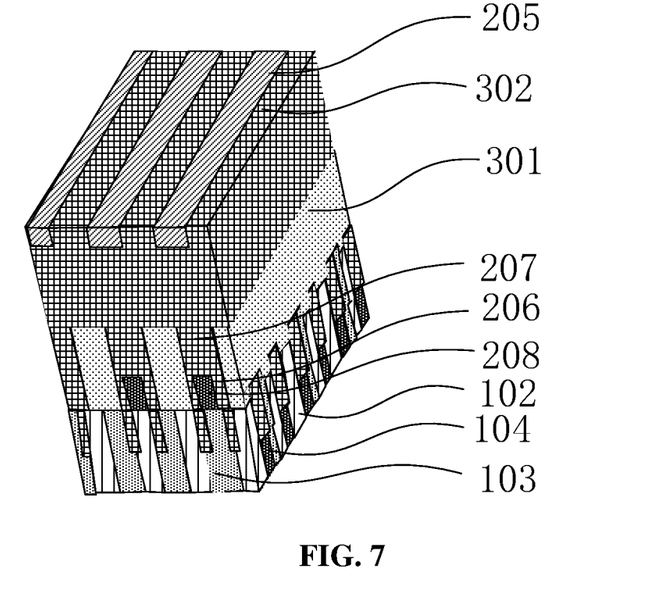
FIG. 7 is a three-dimensional schematic structural diagram of a semiconductor structure obtained after a filling medium layer is formed in one embodiment.

At S4, as shown in FIG. 7, the upper surfaces of the capacitor contact material layers 301 are filled with medium layers 302. Optionally, the medium layers 302 may be a silicon nitride layer. The upper surfaces of the medium layers 302 have the same height as the upper surfaces of the bit lines. Specifically, the upper surfaces of the medium layers 302 and the upper surfaces of the third mask patterns 205 have the same height.

Figure 8:
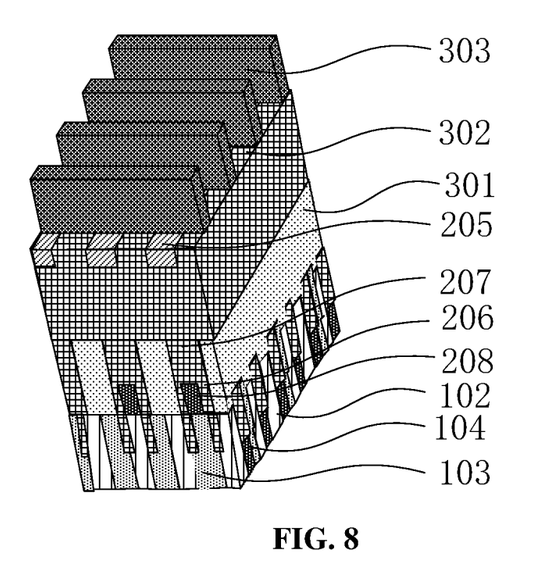
FIG. 8 is a three-dimensional schematic structural diagram of a first mask pattern formed in one embodiment.

At S5, as shown in FIG. 8, several first mask patterns 303 arranged in parallel and at intervals are formed on the medium layers 302 and the bit lines. The first mask patterns 303 extend in the second direction. The second direction intersects perpendicularly with the first direction.

At S6, the medium layers 302 are patterned based on the first mask patterns 303 to form several grooves in the medium layers 302. The specific operations are as follows.

Figure 9:
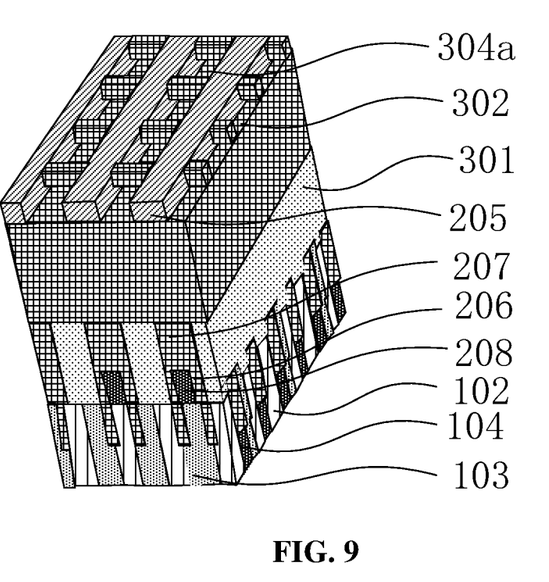
FIG. 9 is a three-dimensional schematic structural diagram of first initial grooves formed in one embodiment.

At S61, the medium layers 302 are etched based on the first mask patterns 303 and the third mask patterns 205 to form first initial grooves 304a.

The first initial grooves 304a may be rectangular. As an example, as shown in FIG. 9, the first initial grooves 304a are square.

Figure 10:
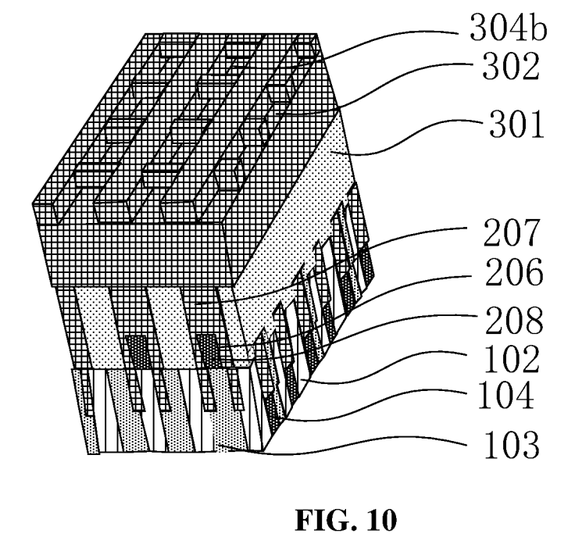
FIG. 10 is a three-dimensional schematic structural diagram of second initial grooves formed in one embodiment.

At S62, the first mask patterns 303 are removed, and the medium layers 302 continue to be etched to transform the first initial grooves 304a to second initial grooves. A sum of the depth of the first initial grooves 304a and the depth of the second initial grooves is less than the thickness of the medium layers 302.

Figure 11:
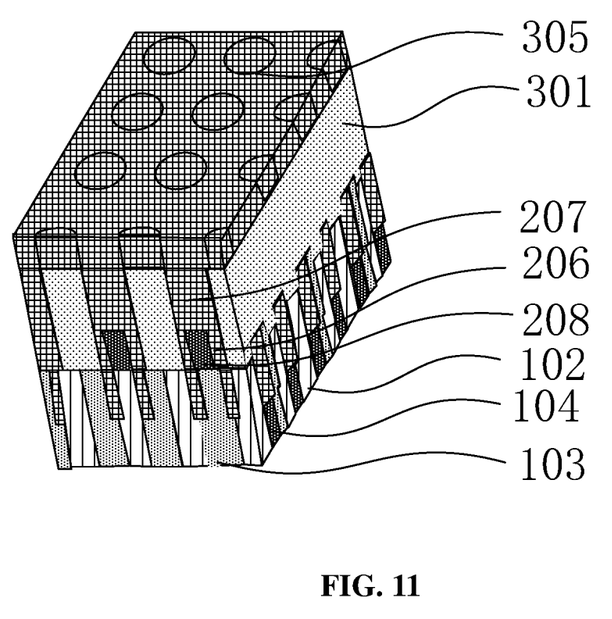
FIG. 11 is a three-dimensional schematic structural diagram of grooves formed in one embodiment.

At S63, the third mask patterns 205 are removed, and the medium layers 302 continue to be etched to transform the second initial grooves to grooves.

As shown in FIG. 10, after the first mask patterns are removed, the medium layers 302 with the first initial grooves 304a continue to be etched, and the thickness of the medium layers 302 is continuously reduced. At the same time, the third mask patterns 205 are removed by etching. The first initial grooves 304a are transformed to the second initial grooves 304b, and the second initial grooves 304b are still square. Since the second initial grooves 304b need to be subsequently etched, the sum depth of the first initial grooves 304a and the second initial grooves 304b needs to be less than the thickness of the medium layers 302.

As shown in FIG. 11, after removing the third mask patterns 205 and obtaining the second initial grooves 304b, the medium layers 302 continues to be etched downward to obtain the grooves 305. The grooves 305 may be circular. At this time, an etching force on edges and corners of the square grooves is increased, so that the second initial grooves 304b are gradually transformed to circular grooves. As an example, the circular grooves may be obtained before the capacitor contact material layers 301 are exposed at the bottoms of the grooves 305, or the circular grooves may be obtained when the capacitor contact material layers 301 are exposed at the bottoms of the grooves.

Figure 12:
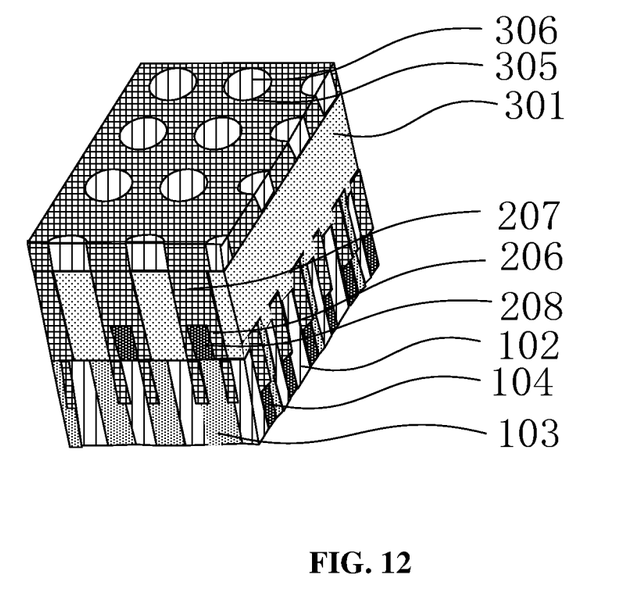
FIG. 12 to FIG. 13 are three-dimensional schematic structural diagrams of a second mask pattern formed in one embodiment.
Figure 13:
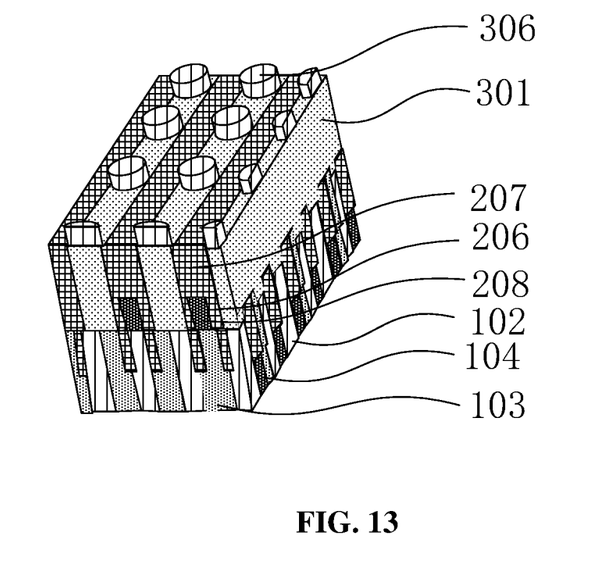

At S7, second mask patterns are formed in the grooves 305. As shown in FIG. 12, specifically, the grooves 305 may be filled with silicon dioxide, so that the silicon dioxide layer in the grooves 305 and the medium layers 302 have the same height to form cylindrical second mask patterns 306. In one embodiment, as shown in FIG. 13, before the capacitor contact material layers 301 are patterned based on the second mask patterns 306, the medium layers 302 wrapped around the second mask patterns 306 needs to be removed first.

Figure 14:
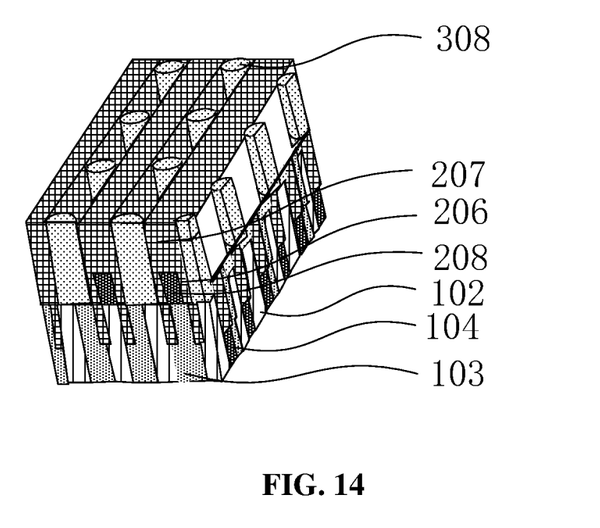
FIG. 14 to FIG. 15 are three-dimensional schematic structural diagrams of a capacitor contact structure formed in one embodiment.
Figure 15:
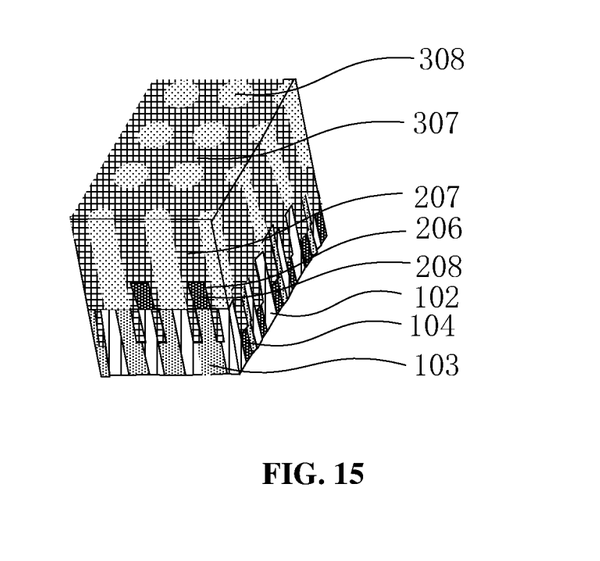

At S8, referring to FIG. 14 to FIG. 15, the capacitor contact material layers 301 are patterned based on the second mask patterns 306 to form several cylindrical capacitor contact structures 308 arranged in parallel and at intervals. Subsequently, the second mask patterns 306 above the capacitor contact structures 308 are removed, and an isolation medium layer 307 is filled between adjacent capacitor contact structures 308 to obtain the final semiconductor structure. Optionally, the material of the isolation medium layer 307 may be silicon nitride.

According to the preparation method of the semiconductor structure, compared with traditional cubic capacitor contact structures, the cylindrical capacitor contact structures 308 obtained by the mask transformation and etching process do not have corner angles, so that leakage is less prone to occur between the capacitor contact structures and the bit lines. Furthermore, in the case that the arrangements and sizes of other structures are same as those in the related art, the contact areas between the capacitor contact structures and active regions are enlarged by changing the cross section of the capacitor contact structure from a square to a circle, so that the performance of the semiconductor structure is improved.

Another embodiment of the present disclosure provides a semiconductor structure, including a base, several bit lines extending in a first direction and arranged in parallel and at intervals on the base, and cylindrical capacitor contact structures 308 located between adjacent bit lines on the base.

With the continuous shrinkage of semiconductor devices, leakage is more and more prone to occur between the capacitor contact structures 308 and the bit lines. This may be alleviated to a certain extent by increasing the thickness of an isolation layer between the capacitor contact structures 308 and the bit lines. However, the volume of the semiconductor structure is inevitably increased. Therefore, within a same volume, leakage is less prone to occur between the cylindrical capacitor contact structures 308 and the bit lines, and contact areas between the capacitor contact structures 308 and the active regions 103 may also be increased, which improves and enhances the performance of the semiconductor structure.

In one embodiment, several buried gate word lines 104 arranged in parallel and at intervals are also formed in the base. The buried gate word lines 104 extend in a second direction. The second direction intersects with the first direction.

In one embodiment, shallow trench isolation structures 102 are also formed in the base. The shallow trench isolation structures 102 isolate several active regions 103 arranged in parallel and at intervals in the base, and the active regions 103 extend in a third direction. The third direction intersects with both the first direction and the second direction.

In one embodiment, the semiconductor structure in the previous embodiment further includes bit line contact structures 106, which located between the active regions 103 and the bit lines, and contacted with the active regions 103 and the bit lines.

In one embodiment, several capacitor contact structures 308 arranged in parallel and at intervals are provided between adjacent bit lines. A medium isolation layer is filled between the capacitor contact structures 308. The capacitor contact structures 308 may be prepared from polycrystalline silicon, and the medium isolation layer may be a silicon nitride layer.

The technical features of the embodiments described above can be arbitrarily combined. In order to make the description concise, all possible combinations of various technical features in the above embodiments are not completely described. However, the combinations of these technical features should be considered as the scope described in the present specification as long as there is no contradiction in them.

The foregoing embodiments represent only a few implementation of the present disclosure, and the descriptions are specific and detailed, but should not be construed as limiting the patent scope of the present disclosure. It should be noted that those of ordinary skill in the art may further make variations and improvements without departing from the conception of the present disclosure, and these variations and improvements all fall within the protection scope of the present disclosure. Therefore, the patent protection scope of the present disclosure should be subject to the appended claims.

The invention claimed is:

1. A preparation method of a semiconductor structure, comprising:
    providing a base;
    forming several bit lines arranged in parallel and at intervals on the base, the bit lines extending in a first direction;
    forming capacitor contact material layers between adjacent bit lines, upper surfaces of the capacitor contact material layers being lower than upper surfaces of the bit lines;
    forming filling medium layers on the capacitor contact material layers;
    forming several first mask patterns arranged in parallel and at intervals on the filling medium layers and the bit lines, the first mask patterns extending in a second direction, and the second direction intersects with the first direction;
    patterning the filling medium layers based on the first mask patterns to form several grooves in the filling medium layers;
    forming second mask patterns in the grooves; and
    patterning the capacitor contact material layers based on the second mask patterns to form several cylindrical capacitor contact structures arranged in parallel and at intervals.

2. The preparation method of a semiconductor structure of claim 1, wherein several buried gate word lines arranged in parallel and at intervals are further formed in the base, and the buried gate word lines extend in the second direction.

3. The preparation method of a semiconductor structure of claim 2, wherein shallow trench isolation structures are further formed in the base; the shallow trench isolation structures isolate several active regions arranged in parallel and at intervals in the base; the active regions extend in a third direction; and the third direction intersects with both the first direction and the second direction.

4. The preparation method of a semiconductor structure of claim 3, further comprising: before forming the bit lines,
    forming a bit line contact hole in the base, wherein a bit line contact hole being located between adjacent buried gate word lines that cross one same active region and being in contact with the active region; and
    forming a bit line contact structure in the bit line contact hole, the bit line contact structure being located between the active region and the bit line and in contact with the active region and the bit line.

5. The preparation method of a semiconductor structure of claim 1, wherein forming several bit lines arranged in parallel and at intervals on the base comprises:
    forming a first conductive material layer, a second conductive material layer, and a coverage medium material layer stacked from bottom up in sequence on the base, and forming third mask patterns on the coverage medium material layer;
    patterning the coverage medium material layer, the second conductive material layer, and the first conductive material layer based on the third mask patterns to obtain stacked structures comprising a first conductive layer, a second conductive layer and the coverage medium material layer which are stacked in sequence from bottom up; and
    forming bit line side walls on side walls of the stacked structures.

6. The preparation method of a semiconductor structure of claim 5, wherein patterning the filling medium layers based on the first mask patterns to form several grooves in the filling medium layer comprises:
    etching the filling medium layers based on the first mask patterns and the third mask patterns to form first initial grooves;
    removing first mask patterns, and continuing to etch the filling medium layers to transform the first initial grooves into second initial grooves, a sum of depths of the first initial grooves and the second initial grooves being less than a thickness of the filling medium layers; and removing the third mask patterns, and continuing to etch the filling medium layers to transform the second initial grooves into the grooves.

7. The preparation method of a semiconductor structure of claim 6, wherein each of the first initial grooves and the second initial grooves comprises a square groove, and each of the grooves comprises a circular groove.

8. The preparation method of a semiconductor structure of claim 1, further comprising: before patterning the capacitor contact material layer based on the second mask patterns, removing the remaining filling medium layers based on the second mask patterns.

9. The preparation method of a semiconductor structure of claim 1, further comprising: after forming the capacitor contact structures, forming an isolation medium layer between adjacent capacitor contact structures.

* * * * *